United States Patent [19]

Chandra et al.

[11] Patent Number: 5,481,135
[45] Date of Patent: Jan. 2, 1996

[54] HERMETIC PROTECTION FOR INTEGRATED CIRCUITS

[75] Inventors: Grish Chandra; Keith W. Michael, both of Midland, Mich.

[73] Assignee: Dow Corning Corporation, Midland, Mich.

[21] Appl. No.: 209,324

[22] Filed: Mar. 10, 1994

Related U.S. Application Data

[63] Continuation of Ser. No. 937,086, Aug. 31, 1992, abandoned.

[51] Int. Cl.$^6$ .......................... H01L 23/053; H01L 23/12
[52] U.S. Cl. .......................... 257/701; 257/703; 257/760; 257/791; 437/235
[58] Field of Search ...................... 257/754, 760, 257/791, 701, 703, 705, 782; 437/235

[56] References Cited

U.S. PATENT DOCUMENTS

| | | | |
|---|---|---|---|
| 3,615,272 | 10/1971 | Collins et al. | 23/366 |
| 4,340,619 | 7/1982 | Gaul, Jr. | 427/228 |
| 4,540,803 | 9/1985 | Cannady | 556/412 |
| 4,749,631 | 6/1988 | Haluska et al. | 428/704 |
| 4,756,977 | 7/1988 | Haluska et al. | 428/704 |
| 4,849,296 | 7/1989 | Haluska et al. | 428/457 |
| 4,888,226 | 12/1989 | Wong | 428/76 |
| 4,999,397 | 3/1991 | Weiss et al. | 524/755 |
| 5,010,159 | 4/1991 | Bank et al. | 528/23 |
| 5,011,706 | 4/1991 | Tamay et al. | 427/39 |
| 5,116,637 | 5/1992 | Baney et al. | 427/340 |
| 5,136,364 | 8/1992 | Byrne | 357/71 |
| 5,145,723 | 9/1992 | Ballance et al. | 427/397.7 |

FOREIGN PATENT DOCUMENTS

| | | |
|---|---|---|
| 0323186 | 7/1989 | European Pat. Off. . |
| 0427395 | 5/1991 | European Pat. Off. . |
| 3805490 | 9/1988 | Germany . |

OTHER PUBLICATIONS

Gentle, 'Oxidation of Hydrogen Silsesquioxane by Vapid Thermal Processing', pp. 146–164.

Electronic packaging & production, vol. 32, No. 2, p. 35.

Chandra, 'Low temperature ceramic coatings for environmental protection of integrated circuits', Electronic Packaging Material Science Symposium, Nov. 26, 1990, Boston, pp. 97–108.

*Primary Examiner*—Robert P. Limanek
*Assistant Examiner*—David Ostrowski
*Attorney, Agent, or Firm*—Roger E. Gobrogge

[57] ABSTRACT

This invention relates to integrated circuits which are protected from the environment. Such circuits are hermetically sealed by applying ceramic layers to the top metallization.

6 Claims, No Drawings

HERMETIC PROTECTION FOR INTEGRATED CIRCUITS

This is a continuation of application Ser. No. 07/937,086 filed on Aug. 31, 1992, now abandoned.

BACKGROUND

The present invention relates to integrated circuits which are protected from the environment. These circuits are inexpensive to fabricate and have improved performance and reliability.

Modern electronic circuits must be able to withstand a wide variety of environmental conditions such as moisture, ions, heat and abrasion. A significant amount of work has been reported directed toward various protective measures to minimize the exposure of such circuits to the above conditions and thereby increase their reliability and life.

Many prior art processes for protecting electronic circuits have involved sealing or encapsulating the circuits after they have been interconnected. For example, it is known in the art to use protective layers of silicones, polyimides, epoxies, other organics, plastics, and the like. Such materials, however, are of only limited value since most are permeable to environmental moisture and ions.

Similarly, interconnected circuits have also been sealed within ceramic packages. This process has proven to be relatively effective in increasing device reliability and is currently used in select applications. The added size, weight and cost involved in this method, however, inhibits widespread application in the electronic industry.

The use of lightweight ceramic protective coatings on electronic devices has also been suggested. For instance, Haluska et al. in U.S. Pat. Nos. 4,756,977 and 4,749,63 1 describe the use of ceramic silica coatings derived from hydrogen silsesquioxane and silicate esters, respectively, as well as additional ceramic layers as hermetic barriers. The present inventors have discovered that when such coatings are applied specifically to integrated circuits at the wafer stage and even though the bond pads are subsequently opened by removing a portion of the coating, the resultant circuits remain hermetically sealed and exhibit increased reliability and life.

Sealing circuits at the wafer stage is also known in the art. For example, it is known in the art to coat fabricated integrated circuits with ceramic materials such as silica and/or silicon nitride by CVD techniques. These coatings are then etched back at the bond pads for the application of leads. The wafers coated in this manner, however, have inadequate reliability and life.

The present inventors have now solved the above problems associated with the hermetic protection of integrated circuits by replacing the conventional passivation on integrated circuits with the silicon containing ceramic coating described herein.

SUMMARY OF THE INVENTION

The present invention relates to hermetically sealed integrated circuits. These circuits comprise the circuit subassemblies having a top layer of metallization including one or more bond pads. To the top layer of metallization is applied a silicon-containing ceramic layer by a process comprising coating the circuit with a composition comprising a preceramic silicon-containing material followed by converting said material to a ceramic. The ceramic layers covering the bond pads may optionally be removed and the resultant open bond pads sealed with one or more non-corroding, conductive layers.

The present invention also relates to a method for producing the above sealed integrated circuits. The method involves applying one or more ceramic layers over the top layer of metallization on the circuit followed by removing at least a portion of the ceramic layer covering the bond pads.

DETAILED DESCRIPTION OF THE INVENTION

The present invention is based on the discovery that integrated circuits can be hermetically sealed by the application of the ceramic coatings taught herein over the top layer of metallization on the circuit. These sealed circuits have increased reliability and performance. In addition, since this process is generally performed at the wafer stage, production can be simplified and, thus, costs reduced.

The integrated circuit subassemblies used in the process of this invention are not critical and nearly any which are known in the art and/or produced commercially are useful herein. The processes used to produce such circuits are also known and not critical to the invention. Exemplary of such circuits are those comprising a semiconductor substrate (eg., silicon, gallium arsenide, etc.) having an epitaxial layer grown thereon. This epitaxial layer is appropriately doped to form the PN-junction regions which constitute the active regions of the device. These active regions are diodes and transistors which form the integrated circuit when appropriately interconnected by a properly patterned metallic layer. This metallic interconnect layer terminates at the bond pads on the exterior surface of the circuit subassembly.

As described above, the prior art describes passivating such circuits with one or more ceramic coatings applied by chemical vapor deposition techniques. These coatings included, for example, silica, silicon nitride or silicon oxynitride derived from precursors such as silane and oxygen, nitrous oxide, nitrogen, ammonia or the like. Circuits coated with such a passivation layer, however, are still prone to damage by the environment. For example, the passivation is prone to penetration of water and/or various destructive ions through defects and cracks. As noted above, the circuit industry has attempted to solve these problems by the use of additional protective measures after the circuits are interconnected. The present invention, on the other hand, describes the application of different ceramic coatings before the interconnection.

In the process of the present invention, the above circuits are sealed by covering the circuit's top metallization with one or more ceramic layers. The first layer is generally a silicon-containing ceramic material which is applied by a process comprising coating the circuit with a composition comprising a preceramic silicon-containing material followed by converting the preceramic silicon-containing material to a ceramic. Typically, the preceramic material is converted to a ceramic by heating it to a sufficient temperature.

As used in the present invention, the term "preceramic silicon-containing material" describes material which can be rendered sufficiently flowable to impregnate and coat the surface of a circuit and which can be subsequently converted to a solid layer exhibiting properties generally recognized by those skilled in the art as characteristic of a ceramic. These materials include, for example, precursors to silicon oxides, silicon nitride, silicon oxynitride, silicon oxycarbide, silicon carbonitride, silicon oxycarbonitride, silicon carbide and the like.

The preferred preceramic compounds to be used in the process of this invention are precursors to silicon oxides, especially silica. The silica precursors which may be used in the invention include, but are not limited to, hydrogen silsesquioxane resin (H-resin), hydrolyzed or partially hydrolyzed $R_nSi(OR)_{4-n}$, or combinations of the above, in which each R is independently an aliphatic, alicyclic or aromatic substituent of 1–20 carbon atoms, preferably 1–4, such as an alkyl (eg. methyl, ethyl, propyl), alkenyl (eg. vinyl or allyl), alkynyl (eg. ethynyl), cyclopentyl, cyclohexyl, phenyl etc., and n is 0–3, preferably 0–1.

H-resin is used in this invention to describe a variety of hydridosilane resins having units of the structure $HSi(OH)_x(OR)_yO_{z/2}$ in which each R is independently an organic group which, when bonded to silicon through the oxygen atom, forms a hydrolyzable substituent, $x= 0-2$, $y= 0-2$, $z= 1-3$, and $x+ y+ z= 3$. These resins may be either fully condensed ($x= 0$, $y= 0$ and $z= 3$) or they may be only partially hydrolyzed (y is not 0 over all the units of the polymer) and/or partially condensed (x is not 0 over all the units of the polymer). Although not represented by this structure, various units of these resins may have either zero or more than one Si-H bond due to various factors involved in their formation and handling. Exemplary of substantially condensed (less than about 300 ppm silanol) H-resins are those formed by the process of Frye et al. in U.S. Pat. No. 3,615,272 which is incorporated herein by reference. This polymeric material has units of the formula $(HSiO_{3/2})_n$ in which n is generally 8–1000. The preferred resin has a number average molecular weight of from about 800–2900 and a weight average molecular weight of between about 8000–28,000 (obtained by GPC analysis using polydimethylsiloxane as a calibration standard). When heated sufficiently, this material yields a ceramic coating essentially free of SiH bonds.

Exemplary H-resin which may not be fully condensed include those of Bank et al. in U.S. Pat. No. 5,010,159, or those of Weiss et al. in U.S. Pat. No. 4,999,397, both of which are incorporated herein by reference. Exemplary H-resin which is not fully hydrolyzed or condensed is that formed by a process which comprises hydrolyzing a hydrocarbonoxy hydridosilane with water in an acidified oxygen-containing polar organic solvent.

A platinum, rhodium or copper catalyst ,lay be admixed with the hydrogen silsesquioxane to increase the rate and extent of its conversion to silica. Any platinum, rhodium or copper compound or complex that can be solubilized in this solution will be operable. For instance, an organoplatinum composition such as platinum acetylacetonate or rhodium catalyst $RhCl_3[S(CH_2CH_2CH_2CH_3)_2]_3$, obtained from Dow Corning Corporation. Midland. Mich. are all within the scope of this invention. The above catalysts are generally added to the solution in an amount of between about 5 and 500 ppm platinum or rhodium based on the weight of resin.

The second type of silica precursor material useful herein includes hydrolyzed or partially hydrolyzed compounds of the formula $R_nSi(OR)_{4-n}$ in which R and n are as defined above. Some of these materials are commercially available, for example, under the tradename ACCUGLASS. Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or OR groups, but a substantial portion of the material is believed to be condensed in the form of soluble Si-O-Si resins. Compounds in which $x= 2$ or 3 are generally not used alone as volatile cyclic structures are generated during pyrolysis, but small amounts of said compounds may be cohydrolyzed with other silanes to prepare useful preceramic materials.

In addition to the above $SiO_2$ precursors, other ceramic oxide precursors may also be advantageously used herein either solely or in combination with the above $SiO_2$ precursors. The ceramic oxide precursors specifically contemplated herein include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed at relatively low temperatures to form ceramic oxides.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, other organic groups bonded to said metal or non-metal through an oxygen such as acetylacetonate or an amine groups. Specific compounds, therefore, include zirconium tetracetylacetonate, titanium dibutoxy diacetylacetonate, aluminum triacetylacetonate, tetraisobutoxy titanium and $Ti(N(CH_3)_2)_4$.

When $SiO_2$ is to be combined with one of the above ceramic oxide precursors, generally it is used in an amount such that the final ceramic contains 70 to 99.9 percent by weight $SiO_2$.

Examples of suitable silicon carbonitride precursors include hydridopolysilazane (HPZ) resin and methylpolydisilylazane (MPDZ) resin. Processes for the production of these materials are described in U.S. Pat. Nos. 4,540,803 and 4,340,619, respectively, both of which are incorporated herein by reference. Examples of silicon carbide precursors include polycarbosilanes and examples of silicon nitride precursors include polysilazanes. Oxygen can be incorporated into the ceramics resulting from the above precursors by pyrolyzing them in an oxygen-containing environment.

The above preceramic material is then used to coat the integrated circuit. The material can be used in any practical form but it is preferred to use a solution comprising the preceramic material in a suitable solvent. If this solution approach is used, the preceramic solution is generally formed by simply dissolving or suspending the preceramic material in a solvent or mixture of solvents. Various facilitating measures such as stirring and/or heat may be used to assist in the dissolution. The solvents which may be used in this method include, for example, alcohols such as ethyl or isopropyl, aromatic hydrocarbons such as benzene or toluene, alkanes such as n-heptane or dodecane, ketones, cyclic dimethylpolysiloxanes, esters or glycol ethers, in an amount sufficient to dissolve the above materials to low solids. For instance, enough of the above solvent can be included to form a 0.1–85 weight percent solution.

The circuit is then coated with this solution by means such as spin, spray, dip or flow coating and the solvent is allowed to evaporate. Any suitable means of evaporation such as simple air drying by exposure to an ambient environment or the application of a vacuum may be used.

Although the above described methods primarily focus on using a solution approach, one skilled in the art would recognize that other equivalent means (eg., melt impregnation) would also function herein and are contemplated to be within the scope of this invention.

The preceramic material is then typically converted to the silicon-containing ceramic by heating it to a sufficient temperature. Generally, the temperature is in the range of about 50° to about 800° C. depending on the pyrolysis atmosphere and the preceramic compound. Preferred temperatures are in the range of about 50° to about 600° C. and more preferably 50°–400° C. Heating is generally conducted for a time sufficient to ceramify, generally up to about 6 hours, with less than about 2 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

Additional coatings may be applied over these coatings if desired. These can include, for example. $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of silacyclobutane. This process is described in U.S. Pat. No. 5,011,706 which is incorporated herein by reference.

After the ceramic layers are applied, the coating covering the bond pads can be etched or partially etched to allow for attachment of leads. The method of etching is not critical and nearly any process known in the art will function herein. This includes, for example, dry etching (eg., with plasma), wet etching (eg., with hydrofluoric acid) and/or laser ablation. If desired, the open bond pads can then be sealed by covering them with one or more non-corroding, conductive layers. The material used for this layer is not critical and can comprise any which is stable in the environment, electrically conductive and useful for interconnecting the circuit. Examples of such materials include gold, copper, silver, tungsten, solder, silver filled epoxy and the like.

The method for applying this layer or layers is likewise not critical. Examples of such processes include sputtering, electron beam evaporation or by merely dispensing the material at the bond pad. These and other processes are known in the art for use within the multiple layers of the circuit and are functional herein.

It should be noted that the materials of the bond pad (eg., aluminum) are often incompatible with the materials of the non-corroding, conductive layer (eg, gold) such that when they are brought into contact with each other intermetallic formation ("purple plague") can damage the circuit. To prevent such damage, it is within the scope of this invention to first apply a diffusion barrier metal layer to the bond pads followed by application of the conductive layers as set forth above. The diffusion barrier metal layers useful herein are known in the art got use within integrated circuits for building the multiple layers of the circuit. Generally, such layers comprise metals such as tungsten or metal alloys such as titanium-tungsten, titanium nitride, and the like.

The method for forming the diffusion barrier metal layers is not critical and many techniques are known in the art. A common approach involves sputtering the diffusion barrier metal layer on the surface of the circuit followed by etching.

If the bond pads are sealed with this conductive layer, additional ceramic coatings may be added to the above ceramic layers by the methods described above to further seal the circuit.

The above sealing processes can be performed at the wafer stage or after dicing. It is preferred herein, however, to seal the devices at the wafer stage for efficiency reasons.

The integrated circuits formed in this manner are hermetically sealed such that their reliability is increased. In addition, the circuits can be handled and manipulated without damage. Furthermore, many of the ceramic layers are opaque to UV and visible light.

Such circuits are then interconnected with each other, with a lead frame, with a circuit board or other external components. Such interconnection can be by conventional leads or by methods such as TAB or "flip chip" processes which are well known in the art.

After interconnection, the device can also be packaged by conventional techniques known in the art. For instance, the device can be embedded within an organic encapsulant such as a polyimide, an epoxy or PARYLENE™ it can be embedded within a silicone encapsulant or it can be included in a plastic package for additional protection.

That which is claimed is:

1. Sealed bond pads on an integrated circuit consisting essentially of:

a circuit subassembly having bond pads;

a first ceramic layer covering the surface of the subassembly around the bond pads;

one or more additional ceramic layers selected from the group consisting of $SiO_2$ coatings, $SiO_2$/ceramic oxide coatings, silicon coatings, silicon carbon containing coatings, silicon nitrogen containing coatings, silicon oxygen nitrogen containing coatings, silicon carbon nitrogen containing coatings and diamond like carbon coatings covering the first ceramic layer; and a non-corroding, conductive layer covering the bond pads;

wherein the first ceramic layer comprises a silicon oxide ceramic material which is deposited by a process comprising coating the surface of the subassembly with hydrogen silsesquioxane resin followed by converting the resin to a ceramic layer.

2. The sealed bond pads of claim 1 which are interconnected and embedded within a material selected from the group consisting of organic encapsulants and silicone encapsulants.

3. The sealed bond pads of claim 1 wherein the ceramic coating is opaque to ultraviolet and visible light.

4. Sealed bond pads on an integrated circuit consisting essentially of:

a circuit subassembly having bond pads;

a ceramic layer covering the surface of the subassembly around the bond pads; and a non-corroding, conductive layer selected from the group consisting of gold, silver, tungsten, solder, silver filled epoxy and copper covering the bond pads;

wherein the ceramic layer comprises a silicon oxide ceramic material which is deposited by a process comprising coating the surface of the subassembly with hydrogen silsesquioxane resin followed by converting the resin to a ceramic layer.

5. The sealed bond pads of claim 4 which are interconnected and embedded within a material selected from the group consisting of organic encapsulants and silicone encapsulants.

6. The sealed bond pads of claim 4 wherein the ceramic coating is opaque to ultraviolet and visible light.

* * * * *